(12) United States Patent
Sato et al.

(10) Patent No.: US 6,638,670 B1
(45) Date of Patent: Oct. 28, 2003

(54) EXPOSURE MASK AND EXPOSURE METHOD USING THE SAME

(75) Inventors: Toshihiko Sato, Niigata-ken (JP); Jun Iwasaki, Niigata-ken (JP); Masaki Ikegami, Niigata-ken (JP); Masami Kobayashi, Niigata-ken (JP); Masaharu Yokoyama, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 66 days.

(21) Appl. No.: 09/664,030

(22) Filed: Sep. 19, 2000

Related U.S. Application Data

(62) Division of application No. 09/291,870, filed on Apr. 14, 1999, now abandoned.

(30) Foreign Application Priority Data

Apr. 23, 1998 (JP) ............................................. 10-113511

(51) Int. Cl.[7] .............................. G03F 9/00; G03C 5/00
(52) U.S. Cl. ............................. 430/22; 430/5; 430/319; 430/320
(58) Field of Search ............................ 29/603; 204/129; 360/103, 106; 430/5, 322, 323, 324, 22, 320, 319

(56) References Cited

U.S. PATENT DOCUMENTS

| | | | |
|---|---|---|---|
| 4,375,390 A | 3/1983 | Anderson et al. .............. 204/15 |
| 5,128,821 A | 7/1992 | Takeuchi et al. .............. 360/103 |
| 5,251,083 A | 10/1993 | Takeuchi et al. .............. 360/103 |
| 5,329,689 A | 7/1994 | Azuma et al. ................. 29/603 |
| 5,799,388 A | 9/1998 | Shouji ...................... 29/603.09 |
| 5,853,959 A | * 12/1998 | Brand et al. ................. 430/320 |
| 5,958,633 A | 9/1999 | Miyatake ........................ 430/5 |

* cited by examiner

*Primary Examiner*—Mark F. Huff
*Assistant Examiner*—Saleha R. Mohamedulla
(74) *Attorney, Agent, or Firm*—Brinks Hofer Gilson & Lione

(57) ABSTRACT

An exposure mask for exposing a photosensitive resist layer formed on the surface of a substrate having an element so that the resist layer remains in the shape of an ABS pattern includes a mark provided within a light transmission section for exposure. The mark determines a relative position between the substrate and the light transmission section on the basis of the element. An exposure method using the exposure mask includes the steps of: determining a relative position between the substrate and the light transmission section on the basis of the element by the mark provided within the light transmission section of the exposure mask; exposing the photosensitive resist layer on the surface of the substrate through the light transmission section of the exposure mask; and developing the exposed photosensitive resist layer so that the resist layer is left in the shape of the ABS pattern.

9 Claims, 4 Drawing Sheets

EXPOSURE MASK AND EXPOSURE METHOD USING THE SAME

This is a divisional of application Ser. No. 09/291,870, filed Apr. 14, 1999 now abandoned.

BACKGROUND OF THE INVENTION

1. Field of the Invention

The present invention relates to an exposure mask which is used, for example, when an etching pattern of an air bearing surface (ABS) is exposed to the surface of a resist layer formed on the surface, that is opposed to a recording medium, of a substrate such as a slider bar, and more particularly, the invention relates to an exposure mask capable of securely aligning itself with the slider bar and to an exposure method using the exposure mask.

2. Description of the Related Art

A magnetic head device mounted on a hard disk drive or the like includes a slider provided on the tip of gimbals composed of a spring material, and on the edge of the slider, a thin film element for recording and reproducing is deposited.

The slider has a flying surface, i.e., a so-called "ABS", which is opposed to the recording medium, and the slider flies above the recording medium by means of air that flows over the surface of the recording medium. While the slider is flying over the recording medium, recording or reproducing is performed on the recording medium by the thin film element provided on the slider.

In order to fabricate the slider, first, a circular ceramic material is formed, and a plurality of thin film elements are formed in parallel on the ceramic material by sputtering. The ceramic material is then sliced to produce a plurality of slender slider bars.

Next, a plurality of slider bars 20 are arrayed in parallel so that surfaces 21 that are opposed to a recording medium are aligned as shown in FIG. 5, and the slider bars 20 are retained by a jig or the like.

As shown in FIG. 5, a plurality of thin film elements 22 appear on the surface 21 of the slider bar 20.

A photosensitive resist layer (not shown on the drawing) is formed on the surface 21.

Next, a plurality of etching patterns of an ABS are exposed onto the surface of the resist layer by using an exposure mask.

FIGS. 6 and 7 show steps in an exposure method using a conventional exposure mask.

First, an exposure mask 23 shown in FIG. 6 is aligned with a slider bar 20 that is disposed on the uppermost or lowermost side shown in FIG. 5.

The exposure mask 23 has a plurality of light transmission sections 24 having the same shape as that of the ABS pattern, and a window 26 having alignment keys (marks) 25 and 25 is provided at least between two light transmission sections 24 and 24.

The exposure mask 23 shown in FIG. 6 is provided with, for example, three light transmission sections 24 and one window 26.

As shown in FIG. 6, a region (diagonally shaded in the drawing) excluding the light transmission sections 24 and the window 26 is deposited with, for example, chromium (Cr) so as not to transmit light. The alignment keys 25 are also composed of a Cr film.

As shown in FIG. 6, the exposure mask 23 is moved up and down from side to side so that the thin film element 22 formed on the slider bar 20 is positioned in the center between the two alignment keys 25 and 25 formed in the window 26 of the exposure mask 23.

After the thin film element 22 is positioned in the center between the alignment keys 25 and 25, the exposure mask 23 is slid to the left by a predetermined distance as shown in FIG. 7.

By sliding the exposure mask 23 to the left, the thin film element 22 is aligned at a predetermined position within the light transmission section 24 formed on the exposure mask 23.

After the slider bar 20 and the light transmission sections 24 of the exposure mask 23 are aligned as described above, the photosensitive resist layer formed on the slider bar 20 is exposed through the light transmission sections 24.

Furthermore, the exposure mask 23 is slid to the left and upward or downward in the drawing and on the unexposed surface 21 of the slider bar 20, the thin film element 22 of the slider bar 20 and the light transmission section 24 of the exposure mask 23 are aligned as described with reference to FIGS. 6 and 7, and then, the photosensitive resist layer formed on the slider bar 20 is exposed.

In this way, a plurality of etching patterns of the ABS are exposed onto the resist layer formed on the surface 21 of all the slider bars 20 shown in FIG. 5.

Since the photosensitive resist layer is of a negative type, the exposed resist layer remains on the surface 21 of the slider bar 20 in the development process and the unexposed resist layer is removed by a developer.

In FIG. 7, the resist layer on the slider bar 20 corresponding to the light transmission sections 24 is left in the same shape as that of the light transmission sections 24 by exposure and the resist layer other than the above is removed.

Although the resist layer on the slider bar 20 corresponding to the window 26 shown in FIG. 7 is also left by exposure, since the slider bar 20 in this section is finally cut along lines A and B shown in FIG. 7 and removed, the shape of the window 26 will not remain on finished sliders.

After exposure and development, a dry etching step is carried out. Then, the slider bar 20 is cut along the lines A and B in FIG. 7 to obtain a plurality of sliders.

The exposure mask 23 shown in FIG. 6, however, gives rise to the following problems.

The alignment keys 25 and 25 formed in the window 26 of the exposure mask 23 are provided only for aligning the light transmission section 24 of the exposure mask 23 and the thin film element 22 of the slider bar 20, and therefore, the shape of the window 26 must not be left by the exposure and development process on finished sliders.

Consequently, as shown in FIGS. 6 and 7, the window 26 is formed between the light transmission sections 24 and 24, and finally, a portion of the slider bar 20 corresponding to the window 26 is removed by being cut along the cutoff lines A and B (refer to FIG. 7).

However a space between the cutoff lines A and B shown in FIG. 7 is very small, and in particular, since sliders are miniaturized as the recording density increases, the space between the cutoff lines A and B is required to be narrowed as much as possible so that the portion of slider bar 20 to be removed is minimized.

Therefore, as the space between the cutoff lines A and B is narrowed, the size of the window 26 in the exposure mask 23 must be decreased. If the window 26 is made smaller, when the exposure mask 23 is slid up and down to align the exposure mask 23 with the slider bar 20, the thin film element 22 fails to be fitted into the window 26, resulting in decrease in alignment accuracy (alignment accuracy of the exposure mask).

Furthermore, when a plurality of slider bars 20 are arrayed in parallel as shown in FIG. 5, etching patterns of the ABS are formed on the slider bar 20 in the exposure step as shown in FIGS. 6 and 7, and then, the exposure mask is slid upward or downward in the drawing to perform the exposure step onto an unexposed slider bar 20.

However, as shown in FIG. 5, there is a possibility that a thin film element 22A on a slider bar 20 disposed uppermost and a thin film element 22B on a slider bar 20 disposed under the above slider bar 20 are not properly arranged in the longitudinal direction in the drawing, and even if the exposure mask 23 is slid downward in the drawing with the thin film element 22A being aligned with the alignment keys 25 and 25 in the window 26 of the exposure mask 23 shown in FIG. 6, the thin film element 22B is not fitted into the window 26 of the exposure mask 23.

Thus, if the thin film element 22B does not appear in the window 26, there is difficulty in determining the correct direction in which the exposure mask 23 is moved, and thus the alignment with the slider bar 20 cannot be performed properly, resulting in decrease in operating efficiency and alignment accuracy.

In order to increase the operating efficiency and the like by using the exposure mask 23 shown in FIGS. 6 and 7, the positional accuracy of the thin film elements 22 formed on the individual slider bars 20 must be increased.

SUMMARY OF THE INVENTION

The present invention overcomes the difficulties noted above with respect to the related art. It is an object of the present invention to provide an exposure mask in which operating efficiency and alignment accuracy can be improved even if sliders are miniaturized and to provide an exposure method using the exposure mask.

In one aspect, in accordance with the present invention, an exposure mask, which is used for exposing a photosensitive resist layer formed on the surface of a substrate having a thin film element on the surface region so that the resist layer is left in the shape of an ABS pattern, includes a mark provided within a light transmission section for determining a relative position between the substrate and the light transmission section on the basis of the thin film element.

In the present invention, preferably, the photosensitive resist layer is of a negative type and the mark is provided within the light transmission section having the shape of the ABS pattern. Alternatively, preferably, the photosensitive resist layer is of a positive type and the mark is provided within the light transmission section excluding a section having the shape of the ABS pattern.

In the present invention, the mark may be provided at a position being shifted by a predetermined distance from the position in which the thin film element is to be placed relative to the exposure mask.

In another aspect, in accordance with the present invention, an exposure method using the exposure mask includes the steps of:

determining a relative position between the substrate and the light transmission section on the basis of the thin film element by the mark provided within the light transmission section of the exposure mask;

exposing the photosensitive resist layer on the surface of the substrate through the light transmission section of the exposure mask; and developing the exposed photosensitive resist layer so that the resist layer is left in the shape of the ABS pattern.

In the present invention, a relative position between the substrate and the light transmission section may be determined by aligning the mark with the thin film element and then by shifting the exposure mask by a predetermined distance.

Conventionally, an exposure mask used in the exposure process has a shape as shown in FIG. 6. Between light transmission sections 24 and 24 having the shape of an ABS pattern, a window 26 is formed having alignment keys (marks) 25 and 25 for aligning the light transmission section 24 of an exposure mask 23 with a thin film element 22 of a slider bar 20.

However, a space between the light transmission sections 24 and 24 is so small that the size of the window 26 cannot be greatly increased. Consequently, even if the exposure mask 23 is moved in order to align the alignment keys 25 in the window 26 with the thin film element 22 of the slider bar 20, the thin film element 22 may not appear in the window 26 formed on the exposure mask 23. When the thin film element 22 does not appear in the window 26 as described above, the exposure mask 23 cannot be properly aligned with the slider bar 20.

Accordingly, in the present invention, in order to form the alignment keys in the largest possible area, the alignment keys are formed within the light transmission section which is required for forming the ABS pattern.

Exposure masks shown in FIGS. 2 and 4 are embodiments of the present invention.

For example, an exposure mask 4 shown in FIG. 2 has two alignment keys 6 and 6 within a light transmission section 5A having the same shape as that of an ABS pattern.

The spot in the light transmission section 5A in which the alignment keys 6 and 6 are formed corresponds to a rail portion of the ABS, and the area thereof is very large.

Therefore, if the alignment keys 6 are formed within the light transmission section 5A, when a plurality of slider bars 1 are arrayed in parallel as shown in FIG. 1 and, for example, by moving an exposure mask 4 shown in FIG. 2 in the vertical direction in the drawing, the exposure mask 4 is transferred from a slider bar 1 to the adjacent slider bar 1, it is highly possible that the thin film element 3 of the adjacent slider bar 1 appears within the light transmission section 5A of the exposure mask 4, and the thin film element 3 can be properly aligned with the alignment keys formed in the light transmission section 5A.

DESCRIPTION OF THE PREFERRED EMBODIMENT

A slider mounted on a magnetic head device is composed of a ceramic material, and a thin film element is deposited on the trailing edge of the slider.

In the thin film element, an MR head for signal reproduction having a magnetoresistive element layer such as an AMR element or spin-valve type thin film element and an inductive head for recording having a core and a coil composed of a magnetic material are deposited.

The slider is provided with a support which includes a flexure and a load beam composed of a leaf spring material and which is mounted on the opposite side of a surface (ABS or flying surface) that is opposed to a recording medium.

The magnetic head device as described above is operated by a CSS method or the like, and when the recording medium starts sliding, an airflow is guided between the slider and the surface of the recording medium, and the slider is lifted from the surface of the recording medium because the flying surface (ABS) has a lifting force applied thereto by the airflow.

In such a flying state, recording or reproducing is performed on the recording medium by the thin film element provided on the trailing edge of the slider.

Next, a fabrication process of the slider will be described.

First, a ceramic material as a base of the slider is circularly formed, and a plurality of thin film elements are formed in parallel on the ceramic material by sputtering. The ceramic material is then sliced to form a plurality of slender slider bars.

Figure 1:
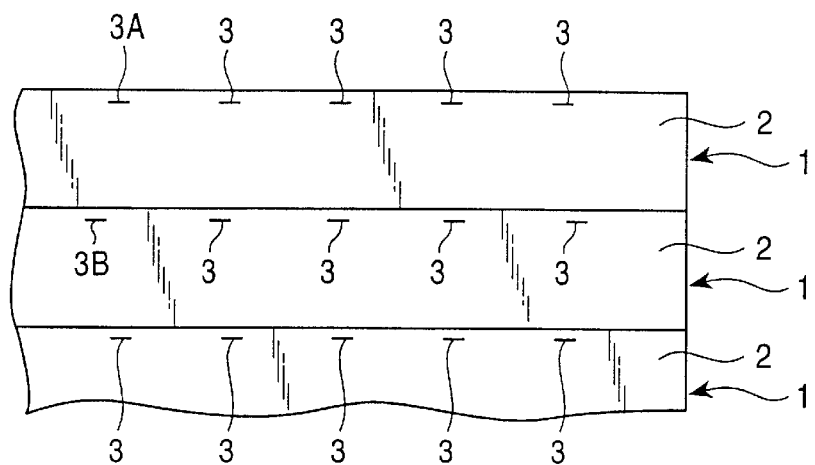
FIG. 1 is a plan view of a plurality of arrayed slider bars, taken from the side of a surface that is opposed to a recording medium.

A plurality of slider bars 1 are arrayed in parallel so that surfaces 2 that are opposed to a recording medium are aligned as shown in FIG. 1, and the slider bars 1 are retained by a jig or the like.

As shown in FIG. 1, a plurality of thin film elements 3 appear on the surfaces 2.

Next, a dry film resist is affixed or a liquid resist is applied to the surface 2 of the slider bar 1. The dry film resist and the liquid resist are of a negative type.

Then, a plurality of etching patterns of an ABS are exposed onto the surface of the resist layer formed on the slider bar 1.

Figure 2:
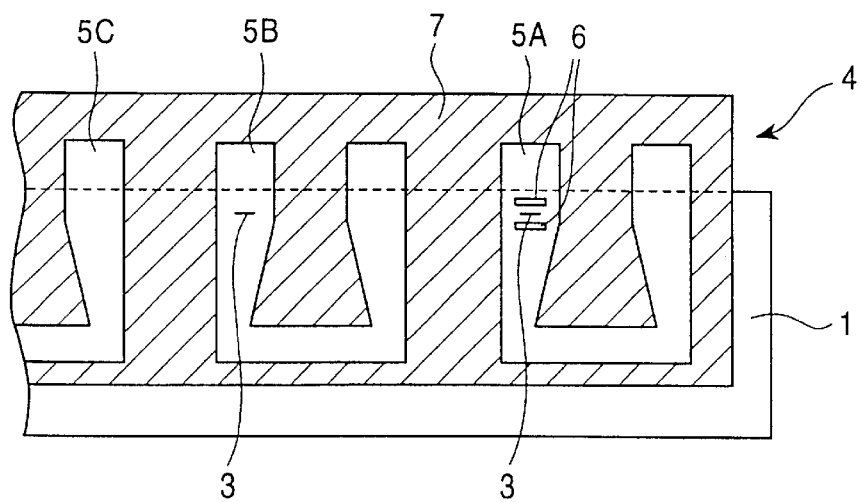
FIG. 2 is a plan view which shows a state in which alignment keys (marks) formed in an exposure mask as a first embodiment of the present invention are aligned with a thin film element of a slider bar.

An exposure mask 4 used in the present invention has a shape as shown in FIG. 2. This shape is used when the resist layer formed on the slider bar 1 is of a negative type.

As shown in FIG. 2, the exposure mask 4 has a plurality of light transmission sections 5A, 5B, 5C, etc., formed in parallel, and a portion other than the light transmission sections is a light shading section 7 in which, for example, chromium (Cr) is deposited.

The light transmission section 5A formed on the farthest right in FIG. 2 has two alignment keys (marks) 6 and 6. The alignment keys 6 are also composed of the Cr film. The size of the alignment key 6 is set smaller than the resolution of the resist, and the pattern of the alignment key 6 is not formed onto the surface of the resist layer on the slider bar 1.

In the present invention, there is no limitation of the shape of the alignment keys 6 and 6. Although the alignment keys 6 and 6 shown in FIG. 2 are formed linearly, they may be dots or may be shaped otherwise. In the present invention, there is also no limitation of the number of alignment keys 6.

Although, in this embodiment, the alignment keys 6 and 6 are formed in one light transmission section 5A only, the alignment key 6 may be also formed in other light transmission sections.

The exposure mask 4 shown in FIG. 2 has, for example, three light transmission sections 5A, 5B, and 5C, and the alignment keys 6 and 6 are formed in one light transmission section 5A.

The light transmission sections 5A, 5B, and 5C have the same shape as that of an ABS pattern to be formed onto the surface of the resist layer on the slider bar 1, and as shown in FIG. 2, for example, the light transmission sections 5A, 5B, and 5C are U-shaped in correspondence with the ABS pattern.

The spot in which the alignment keys 6 are formed in the light transmission section 5A corresponds to a rail portion of the ABS, and the area thereof is very large.

As shown in FIG. 2, the exposure mask 4 is aligned with the slider bar 1 so that the thin film element 3 is positioned in the center between the two alignment keys 6 and 6 provided in the light transmission section 5A of the exposure mask 4.

Figure 3:
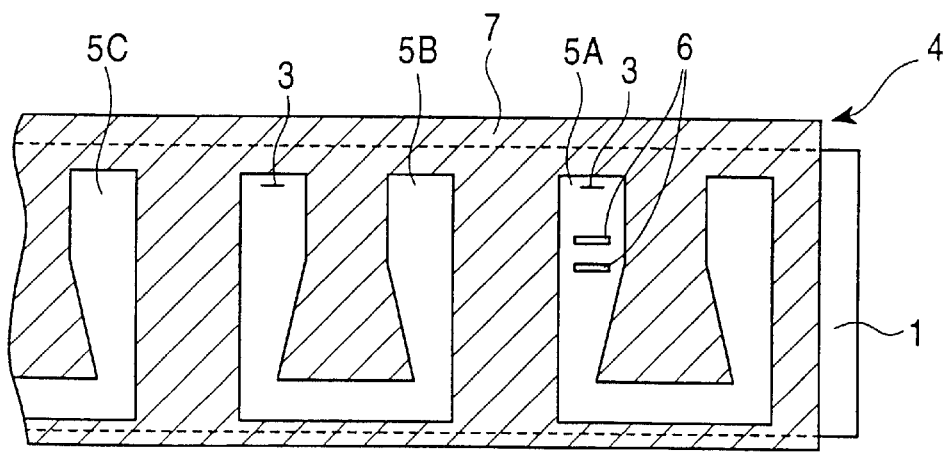
FIG. 3 is a plan view which shows a state in which the exposure mask is shifted by a predetermined distance from the state shown in FIG. 2.

Then, as shown in FIG. 3, by sliding the exposure mask 4 downward in the drawing by a predetermined distance, the alignment of all of the light transmission sections 5A, SB, and 5C of the exposure mask 4 with the thin film elements 3 is completed.

Additionally, in the present invention, as shown in FIG. 3, since the thin film element 3 in the light transmission section 5A of the aligned exposure mask and two alignment keys 6 are arranged in the longitudinal direction in the drawing, after the alignment keys 6 are aligned with the thin film element 3 as shown in FIG. 2, by sliding the exposure mask 4 in one direction (downward in the drawing) only, the alignment of the light transmission sections 5A, 5B, and 5C of the exposure mask 4 with the slider bar 1 can be completed.

In a state as shown in FIG. 3, the etching patterns of the ABS are exposed onto the surface of the resist layer on the surface 2 of the slider bar 1 through the light transmission sections 5A, 5B, and 5C.

Next, the exposure mask is slid toward the left in the drawing. By sliding, a thin film element 3 on the unexposed surface 2 of the slider bar 1 appears in the light transmission section 5A.

The position of the exposure mask 4 is then adjusted by moving the exposure mask 4 up and down and from side to side so that the thin film element 3 is placed in the center between the alignment keys 6 and 6 formed in the light transmission section 5A.

Next, as described above, the exposure mask 4 is slid downward in the drawing (refer to FIG. 3) and exposure is performed.

The steps described above are repeated in order to expose a plurality of the etching patterns of the ABS onto the entire surface of the resist formed on one slider bar 1.

After one slider bar 1 is subjected to the exposure process, the exposure mask 4 is slid upward or downward in the drawing, and with respect to the resist layer on a slider bar 1 that is adjacent to the slider bar 1, the light transmission section 5A of the exposure mask 4 is aligned with a thin film element 3 of the slider bar 1, and then exposure is performed.

In such a manner, the etching patterns of the ABS are exposed and formed onto the surface of the resist layer formed on the surface 2 of all the slider bars 1 shown in FIG. 1.

Next, by using a developer, an unwanted portion of the resist layer is removed.

As described above, since the resist layer formed on the surface 2 of the slider bar 1 is of a negative type, the exposed portion, that is, the resist layer having the same shape as that of the light transmission section 5 in the exposure mask 4 shown in FIG. 3, is left on the surface 2 of the slider bar 1, and the resist layer corresponding to the light shading section 7 is removed.

After the resist layer is removed, dry etching is performed on the portion of the slider bar 1 in which the surface 2 is exposed, and then, the resist layer remaining on the surface 2 is removed. Thus, a plurality of ABSs having a given pattern can be formed on the surface 2 of all the slider bars 1.

Finally, by cutting off the slider bar 1 by the ABS, a plurality of sliders can be obtained from the slider bar 1.

Since the alignment keys 6 formed in the light transmission section 5A of the exposure mask 4 is composed of a Cr film, the portion of the alignment keys 6 is not exposed onto the surface of the resist layer formed on the surface 2 of the slider bar 1. However, since the size of the alignment keys 5 is set smaller than the resolution of the resist and the space between the alignment keys 6 and 6 is very small, when exposure is performed in a state as shown in FIG. 3, the surface of the resist layer lying beneath the alignment keys 6 is also exposed.

Therefore, the pattern of the alignment keys 6 is not formed onto the surface of the resist layer which is left in the same shape as that of the light transmission section 5A after exposure and development, and thus, even if the alignment keys 6 are formed in the light transmission section 5 of the exposure mask 4, the formation of the ABS is not greatly affected.

As shown in FIG. 3, although the alignment keys 6 and 6 in the light transmission section 5A of the exposure mask 4 are formed at the position being shifted by a predetermined distance from the position in which the thin film element 3 is to be placed in the light transmission section 5A, in accordance with the present invention, the alignment keys 6 and 6 may be formed in advance so that the center between the alignment keys 6 and 6 is placed at the same position as that of the thin film element to be placed in the light transmission section 5A.

As described above, by setting in advance the center between the alignment keys 6 and 6 in the light transmission section 5A at the same position in which the thin film element 3 is to be placed in the light transmission section 5A, exposure can be performed immediately after the thin film element 3 is aligned in the center between the alignment keys 6 and 6. That is, a step of sliding the exposure mask 4 as shown in FIG. 3 can be omitted.

In the present invention, even if, for example, as shown in FIG. 1, a thin film element 3A of a slider bar 1 arrayed uppermost in the drawing and a thin film element 3B of a slider bar 1 arrayed underneath the above slider bar 1 are not properly arranged in the longitudinal direction in the drawing, since the alignment keys 6 formed on the exposure mask 4 are placed in the light transmission section 5A having a large area, the thin film element does not go out of the light transmission section 5A of the exposure mask 4, and the light transmission section 5A of the exposure mask 4 can be easily aligned with the thin film element of the slider bar 1.

Figure 6:
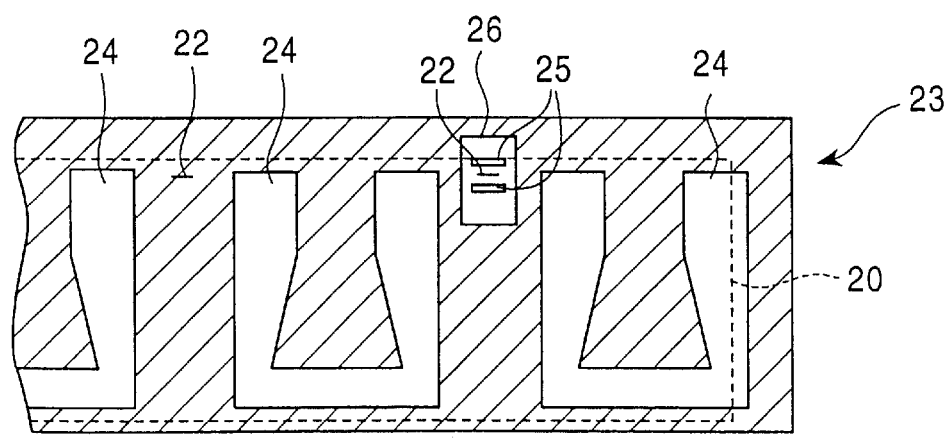
FIG. 6 is a plan view which shows a state in which the alignment keys (marks) formed in a conventional exposure mask are aligned with a thin film element of a slider bar.
Figure 7:
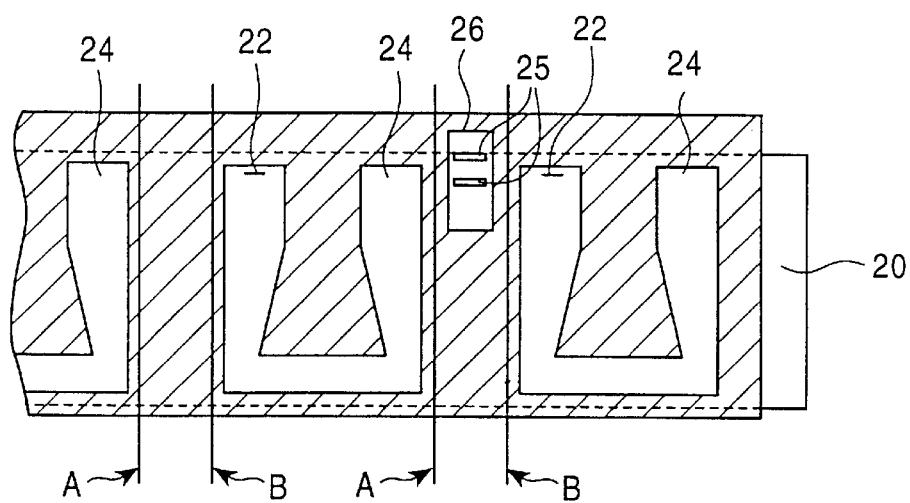
FIG. 7 is a plan view which shows a state in which the exposure mask is shifted by a predetermined distance from the state shown in FIG. 6.

The misalignment rate (recognition error rate) was measured with respect to a case when the exposure mask 4 shown in FIG. 2 was aligned with a plurality of slider bars 1 shown in FIG. 1 and a case when the conventional exposure mask 23 was aligned with the slider bars 1. As shown in Table 1, when the exposure mask 4 shown in FIG. 2 was used, the error rate was 1.2%, and when the exposure mask 23 shown in FIG. 6 was used, the error rate was 14%.

TABLE 1

|  | Recognition error rate |
| --- | --- |
| Mask in the present invention | 1.20% |
| Conventional mask | 14.00% |

Figure 4:
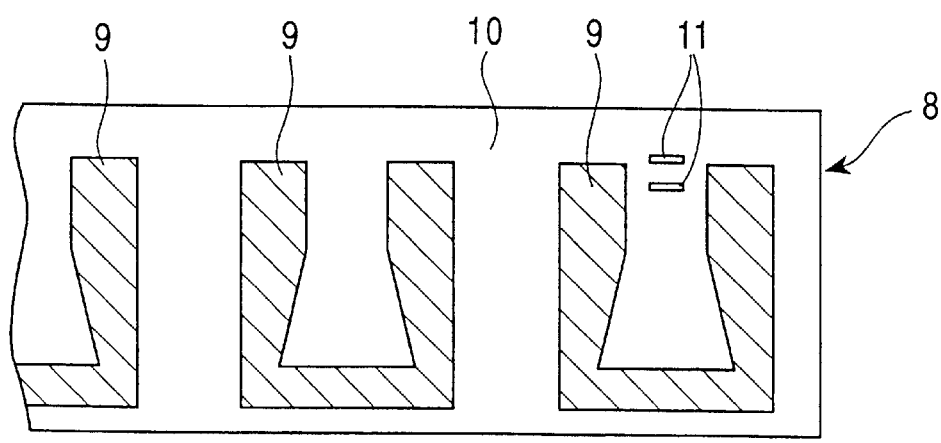
FIG. 4 is a plan view which shows the shape of an exposure mask as a second embodiment of the present invention.
Figure 5:
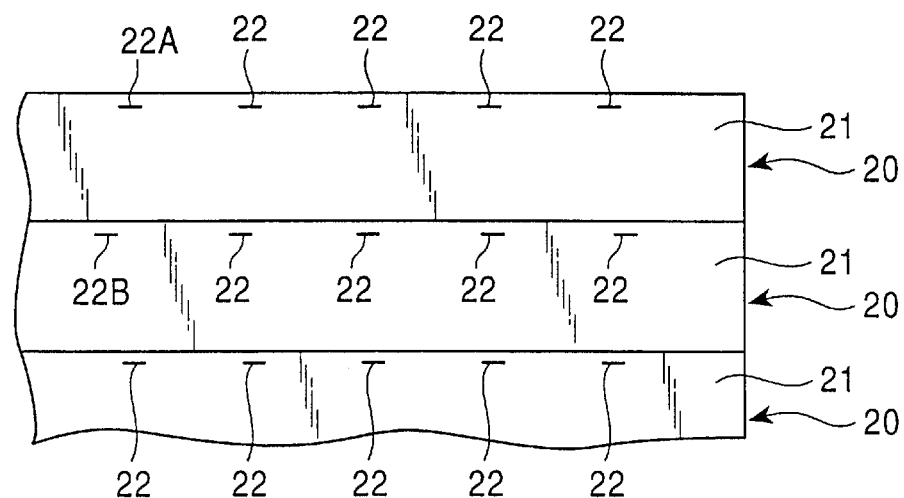
FIG. 5 is a plan view of a plurality of arrayed slider bars, taken from the side of a surface that is opposed to a recording medium.

When a positive resist layer is formed on the surface 2 of the slider bar 1, an exposure mask used for exposure has a shape as shown in FIG. 4.

In an exposure mask 8 shown in FIG. 4, numeral 9 represents a light shading section which has the same shape as that of an ABS pattern and is composed of a Cr film or the like.

On the other hand, a portion excluding the light shading section 9 is a light transmission section 10, and alignment keys 11 and 11 composed of a Cr film are formed in the light transmission section 10.

In the present invention, the alignment keys 11 may be formed at any position within the light transmission section 10. In this way, in the present invention, the alignment keys 11 can be formed within a large area (the light transmission section 10).

The exposure method using the exposure mask 8 is the same as that described with reference to FIGS. 2 and 3.

That is, first, the exposure mask 8 is aligned with the slider bar 1 so that the thin film element 3 of the slider bar 1 (refer to FIG. 1) is placed in the center between the two alignment keys 11 and 11 formed in the light transmission section 10 of the exposure mask 8 shown in FIG. 4.

Next, by sliding the exposure mask 8 by a predetermined distance, the thin film element 3 of the slider bar 1 is placed at a predetermined position in the light shading section 9 of the exposure mask 8.

Additionally, since the position of the alignment keys 11 formed in the light transmission section 10 of the exposure mask 8 shown in FIG. 4 and the position of the thin film element 3 placed at the predetermined position in the light shading section 9 are arranged in the horizontal direction in the drawing, after the alignment keys 11 are aligned with the thin film element 3, by sliding the exposure mask 8 in one direction (the left or right direction in the drawing), the alignment between the light shading section 9 of the exposure mask 8 and the slider bar 1 can be completed.

After the slider bar 1 is aligned with the exposure mask 8, exposure and development are performed.

The exposed resist layer is removed by a developer, and on the surface 2 of the slider bar 1, the resist layer having the same shape as that of the light shading section 9 shown in FIG. 4 remains.

Next, after dry etching is performed and the remaining resist layer is removed, a plurality of ABS patterns having the predetermined shape are formed on the surface 2 of the slider bar 1.

As described above, in the present invention, an exposure mask used for exposing the photosensitive resist layer formed on the surface (surface 2) of the slider bar 1 having the thin film element 3 and leaving the resist layer in an ABS pattern includes marks (alignment keys), provided in the light transmission section represented by numerals 5A, 5B, and 5C in FIG. 2 and by numeral 10 in FIG. 4, for determining a relative position between the slider bar 1 and the light transmission section on the basis of the thin film element 3.

In the present invention, in particular, even if the size of the slider bars 1 is decreased as sliders are miniaturized, by providing marks for alignment in a light transmission section having a large area, the alignment between the slider bar 1 and the light transmission section on the basis of the thin film element 3 can be performed easily, and thus, alignment accuracy and operating efficiency can be improved.

By providing marks in the light transmission section having a large area, even if the positional accuracy of the thin film element 3 formed on the slider bar 1 is not great, the thin film element 3 is easily fitted into the light transmission section formed on the exposure mask, and thus, the thin film element 3 of the slider bar 1 can be properly aligned with the light transmission section of the exposure mask.

As described above in detail, in the present invention, an exposure mask used for exposing a photosensitive resist layer formed on the surface of the slider bar having a thin film element so that the resist layer is left in the shape of an ABS pattern includes marks provided within a light transmission section for determining a relative position between a substrate and the light transmission section on the basis of the thin film element.

In the present invention, in particular, even if the size of slider bars is decreased as sliders are miniaturized, by providing marks for alignment in a light transmission section having a large area, the alignment between the slider bar and the light transmission section on the basis of the thin film element can be performed easily, and thus, alignment accuracy and operating efficiency can be improved.

In the present invention, the photosensitive resist layer may be of a negative type or of a positive type, and by providing marks in the light transmission section; the advantages can be achieved.

What is claimed is:

1. A method of fabricating a magnetic head comprising:

forming a photosensitive resist layer on a surface of a substrate having a thin film element, the thin film element being partially exposed on the surface of the substrate;

determining a relative position between the substrate and an exposure mask, the exposure mask causing a portion of the photosensitive resist layer in the shape of an air bearing surface pattern to remain by having a light transmission section in the shape of the air bearing surface pattern;

exposing the photosensitive resist layer on the surface of the substrate through the light transmission section of the exposure mask; and developing the exposed photosensitive resist layer such that a portion of the photosensitive resist layer having the shape of the air bearing surface pattern remains, wherein the exposure mask has an alignment mark provided within the light transmission section, and wherein in determining the relative position between the substrate and the exposure mask, the relative position between the substrate and the exposure mask is determined based on a relative position between the thin film element exposed on the surface and the alignment mark.

2. A method of fabricating a magnetic head according to claim 1, further comprising selecting the mark to be smaller than a resolution of the photosensitive resist layer.

3. A method of fabricating a magnetic head according to claim 1 the determining the relative position between the exposure mask and the substrate further comprising determining the relative position between the substrate and the light transmission section by aligning the mark with the element and by shifting the exposure mask by a predetermined distance.

4. A method of fabricating a magnetic head according to claim 1, further comprising selecting the photosensitive resist layer to be a negative photosensitive resist layer.

5. A method of fabricating a magnetic head according to claim 1, further comprising selecting the photosensitive resist layer to be a positive photosensitive resist layer.

6. The method of claim 1, further comprising selecting the alignment mark such that when the photosensitive resist layer is exposed through the light transmission section of the exposure mask, the alignment mark does not substantially alter development properties of the exposed photosensitive resist layer within the air bearing surface pattern.

7. The method of claim 1, further comprising selecting the alignment mark such that when the photosensitive resist layer is exposed through the light transmission section of the exposure mask no alignment mark is formed in the exposed photosensitive resist layer.

8. A method of fabricating multiple magnetic heads comprising fabricating the magnetic heads by the method of claim 1 at the same time without creating a sacrificial area of the substrate containing alignment marks and separating the magnetic heads.

9. The method of claim 8, further comprising separating the magnetic heads without physically removing any sacrificial area containing alignment marks from active portions of the substrate.

* * * * *